United States Patent
Zhao et al.

(10) Patent No.: US 11,101,296 B2
(45) Date of Patent: Aug. 24, 2021

(54) DEVICE HAVING PIXEL ISLAND, PREPARATION METHOD THEREOF, AND DISPLAY DEVICE

(71) Applicant: BOE TECHNOLOGY GROUP CO., LTD., Beijing (CN)

(72) Inventors: Meng Zhao, Beijing (CN); Weixin Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 42 days.

(21) Appl. No.: 16/491,841

(22) PCT Filed: Feb. 1, 2019

(86) PCT No.: PCT/CN2019/074412
§ 371 (c)(1),
(2) Date: Sep. 6, 2019

(87) PCT Pub. No.: WO2020/001032
PCT Pub. Date: Jan. 2, 2020

(65) Prior Publication Data
US 2020/0381455 A1    Dec. 3, 2020

(30) Foreign Application Priority Data

Jun. 26, 2018  (CN) .......................... 201810671717.7

(51) Int. Cl.
*H01L 27/12*    (2006.01)
*H01L 27/32*    (2006.01)
*H01L 27/146*   (2006.01)

(52) U.S. Cl.
CPC ........ *H01L 27/124* (2013.01); *H01L 27/1218* (2013.01); *H01L 27/1259* (2013.01); *H01L 27/14603* (2013.01); *H01L 27/14609* (2013.01); *H01L 27/3276* (2013.01)

(58) Field of Classification Search
CPC .............. H01L 27/124; H01L 27/1218; H01L 27/1259; H01L 27/14603; H01L 27/14609; H01L 27/3276; H01L 27/3244; H01L 2227/323
See application file for complete search history.

(56) References Cited

U.S. PATENT DOCUMENTS

2005/0287846 A1* 12/2005 Dozen ............... H01L 29/78603
439/85

FOREIGN PATENT DOCUMENTS

| CN | 104347819 A | 2/2015 |
|---|---|---|
| CN | 107871761 A | 4/2018 |
| CN | 107871770 A | 4/2018 |
| CN | 107994052 A | 5/2018 |
| CN | 108878486 A | 11/2018 |

* cited by examiner

*Primary Examiner* — Kyoung Lee
(74) *Attorney, Agent, or Firm* — The Webb Law Firm (57) ABSTRACT

The present disclosure provides a device, a preparing method thereof, and a display device. A device comprises: a flexible substrate; at least two islands on the flexible substrate, each of the islands including a semiconductor layer, adjacent islands being separated by a trench; and at least one inter-island connection line each for electrically connecting corresponding islands.

19 Claims, 4 Drawing Sheets

Forming a plurality of pixel islands 20 and trenches 30 between adjacent pixel islands 20 on a flexible substrate 10, the pixel islands 20 provided with thin film transistors 200 and signal lines electrically connected to the thin film transistors 200 — S1

Forming an inter-island connection line 40 for connecting adjacent pixel islands 20 at a position corresponding to the trench 30, the inter-island connection line 40 electrically connecting the signal lines of the adjacent pixel islands 20 — S2

DEVICE HAVING PIXEL ISLAND, PREPARATION METHOD THEREOF, AND DISPLAY DEVICE

CROSS-REFERENCE TO RELATED APPLICATIONS

The present application is a U.S. National Stage Application under 35 U.S.C. § 371 of International Patent Application No. PCT/CN2019/074412, filed on Feb. 1, 2019, which claims priority to the Chinese Patent Application No. 201810671717.7, filed on Jun. 26, 2018, the contents of both of which are incorporated herein in their entirety by reference.

FIELD

The present disclosure relates to the field of display technologies, and in particular, to a device having a pixel island, a method for preparing the same, and a display device.

BACKGROUND

Organic Light Emitting Diode (OLED) has become a mainstream product in the display field due to its low power consumption, wide viewing angle, ultra-thin, high color saturation, and flexibility, and widely used in the end products such as smartphones, tablets, monitors and TVs.

One of the advantages of OLED display substrates is flexibility, and with the OLED display substrates in which OLED devices are formed on a flexible substrate, flexible display devices can be achieved. However, with the increasing popularity of wearable devices, it has placed higher demands on the tensile properties of OLED flexible panels. Since each pixel of the OLED display substrate is provided with a separate driving circuit, this results in not only a higher pixel density but also dense wirings. Therefore, it is relatively difficult to realize stretchable OLED display substrate. In addition, the bending property of the OLED display substrate may also be affected.

For other types of display substrates, such problems may also be similarly present.

It should be noted that the information disclosed in the Background section as above is only for better understanding of the background of the present disclosure, and thus may include information that does not pertain to prior art known to those of ordinary skill in the art.

SUMMARY

One of the objects of some embodiments of the present disclosure is to provide a device, a method of preparing the same, and a display device.

Other features and advantages of the present disclosure will be apparent from the following detailed description, or partly known by practicing the present disclosure.

According to an aspect of the present disclosure, there is provided a device comprising: a flexible substrate; at least two islands on the flexible substrate, each of the islands including a semiconductor layer, adjacent islands being separated by a trench; at least one inter-island connection line each for electrically connecting corresponding islands.

In some embodiments, the device further comprises: an organic insulating material filled in the trench.

In some embodiments, the at least one inter-island connection line is configured to: span over a corresponding trench, or be at least partially received in the corresponding trench.

In some embodiments, the inter-island connection line is made of a flexible material or has a shape suitable for being stretched.

In some embodiments, the islands have a shape comprising circle or polygon, and the polygon comprises any one of a triangle, a diamond, and a rectangle.

In some embodiments, the islands are adaptable to form pixels therein, the pixel comprising a device for receiving or emitting light and a semiconductor device associated therewith.

In some embodiments, the device further comprises: an insulating layer located between the at least one inter-island connection line and corresponding islands, wherein the at least one inter-island connection line is electrically connected to a component in the corresponding island through a hole in the insulating layer.

In some embodiments, the insulating layer comprises one of the following: an organic insulating layer or an inorganic insulating layer.

In some embodiments, the islands include thin film transistors which include sources and drains, and wherein the inter-island connection line is located at a different layer from the sources and the drains.

In some embodiments, the device is a display substrate or a sensor substrate.

In some embodiments, each of the islands includes: a buffer layer over the flexible substrate; and the semiconductor layer over the buffer layer, wherein the trench extends to the flexible substrate.

In some embodiments, each of the islands comprises a component for electrical connection, wherein each of the at least one inter-island connection line is electrically connected to the component for electrical connection of the corresponding island, wherein the inter-island connection line is located at a different layer from the component for electrical connection.

According to another aspect of the present disclosure, there is provided a display device comprising a device according to any embodiments.

According to a further aspect of the present disclosure, there is provided a method of preparing a device comprising: forming at least two islands on the flexible substrate, the adjacent islands being separated by a trench, the island comprising a semiconductor layer; forming at least one inter-island connection line for electrically connecting corresponding islands.

In some embodiments, the at least one inter-island connection line is configured to be stretchable.

In some embodiments, the at least inter-island connection line spans over the corresponding trench or is received in the corresponding trench.

In some embodiments, the method further comprises, after forming the at least two islands and prior to forming the at least one inter-island connection line: filling the trench with an insulating material.

In some embodiments, the insulating material comprises an organic insulating material.

In some embodiments, the method further comprises, after filling the trench with the insulating material and prior to forming the at least one inter-island connection line: forming an insulating layer over the islands and the insulating material, the insulating layer including at least one opening; wherein, forming the at least one inter-island connection line comprises: forming the at least one inter-island connection line over the insulating layer, the at least one inter-island connection line filling a corresponding opening and being electrically connected with a corresponding island.

In some embodiments, each of the islands comprises a component for electrical connection, wherein each of the at least one inter-island connection line is electrically connected to the component for electrical connection of a corresponding island, wherein the inter-island connection line is located at a different layer from the component for electrical connection.

According to the display substrates, methods of preparing the same, and display devices of the exemplary embodiments of the present disclosure, a pixel region are divided into a plurality of pixel islands by trenches, and signal connection between adjacent pixel islands are achieved by providing inter-island connection lines over the corresponding trenches. According to the exemplary embodiments of the present disclosure, the tensile properties and the bending properties of the display substrates can be effectively improved while ensuring signal communication. According to the exemplary embodiments of the present disclosure, display substrates or sensor substrates having improved tensile properties and bending properties, such as a bendable OLED display substrate, a CIMS sensor substrate, or the like, can be provided.

The above general description and the following detailed description are intended to be illustrative and exemplary, and not for limiting the scope of the present disclosure.

BRIEF DESCRIPTION OF THE DRAWINGS

The accompanying drawings, which are incorporated in the specification and constitute a part of the specification, illustrate some embodiments of the present disclosure, and are used to explain, together with, the principles of the present disclosure. It is apparent that the drawings described in the following description are only some of the embodiments of the present disclosure, and from the drawings other drawings can be obtained by those skilled in the art without creative efforts.

DETAILED DESCRIPTION OF THE EXEMPLARY EMBODIMENTS

Exemplary embodiments will now be described fully with reference to the accompanying drawings. However, the exemplary embodiments can be embodied in a variety of forms and shall not be construed as being limited to those examples set forth herein; rather, these embodiments are provided for fully and completely illustrating the present disclosure and conveying the principles of the embodiments to those skilled in the art. Those features, structures, characteristics, or the like which are described or to be described, may be combined in any suitable manner in one or more embodiments.

In addition, the drawings are merely schematic representations of the embodiments of the present disclosure, and are not necessarily drawn to scale. Like reference numerals denote the like or similar parts in the drawings, and the repeated description thereof will be omitted.

According to an example embodiment of the present disclosure, there is provided a device which may comprises: a flexible substrate; at least two islands on the flexible substrate, wherein adjacent islands are separated by a trench; and at least one inter-island connection line each for connecting the corresponding islands. In some implementations, the island may comprise a semiconductor layer. In some implementations, the at least one inter-island connection line can be configured to be stretchable.

In the following description, description will be given by taking display substrate as an example, and the island will be referred to as a pixel island. However, it should be understood that the device described in the present disclosure shall not be limited to the display substrate; for example, it may be a sensor substrate. In addition, it should also be understood that the display substrate described herein can be applied to, but not limited to, a bendable OLED display.

Figure 1:
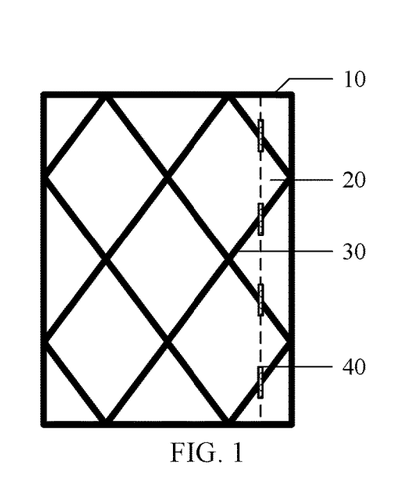
FIG. 1 is a plan view schematically showing a display substrate according to an exemplary embodiment of the present disclosure.
Figure 2:
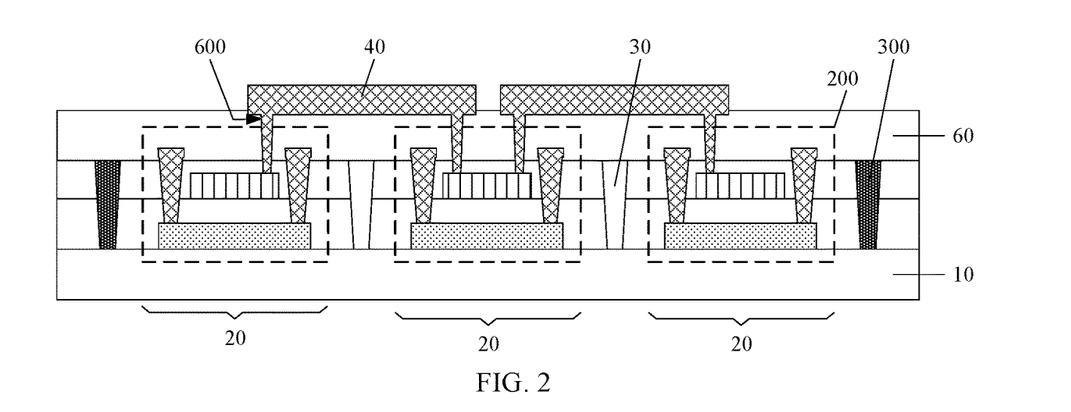
FIG. 2 is a schematic structural view showing a display substrate according to an exemplary embodiment of the present disclosure.

As shown in FIG. 1, the device (e.g., a display substrate) may include a flexible substrate 10, a plurality of pixel islands 20 on the flexible substrate 10, trenches 30 between adjacent pixel islands 20, and inter-island connection lines 40 for connecting adjacent pixel islands 20. FIG. 2 schematically shows a partial cross-sectional view of the device shown in FIG. 1.

In some embodiments of the present disclosure, the pixel island is adaptable to form a pixel therein. The pixel may include a device for receiving or emitting light (e.g., a light emitting diode or photodiode, etc.) and a semiconductor device (such as, but not limited to, a switching device, a capacitor, etc.) associated with the device for receiving or emitting light. In various embodiments, the pixels can be configured to receive or emit light. In some embodiments, a pixel may include one or more sub-pixels, such as a sub-pixel for red, a sub-pixel for blue, a sub-pixel for green, and the like. In the case of a display substrate, the pixel or sub-pixel may include, for example, a light emitting diode. In the case of a sensor substrate, the pixel or sub-pixel may comprise, for example, a photodiode. It should be understood that the present disclosure is not limited to these cases.

As shown in FIG. 2, the pixel island 20 may be provided with a thin film transistor 200. The pixel island 20 may also be provided with components for electrical connection, for example, components electrically connected to the thin film transistor 200 or other electronic devices, such as but not limited to, terminals, doped active regions, metal wiring, or polysilicon wirings, etc. The components for electrical connection may be used for internal electrical connections. The components for electrical connection may also be used to carry signals or power, such as scan signals, data signals, and/or power supplies, etc. It is to be understood that the signal lines in an island can be connected in various manners known or future developed.

The inter-island connection line 40 can be used to connect corresponding pixel islands. For example, as shown in FIG. 2, the inter-island connection line 40 electrically connects the electrical connection components (e.g., signal lines) of adjacent pixel islands 20 to achieve signal communication between adjacent pixel islands 20. In the example shown in FIG. 2, the inter-island connection lines 40 may include, for example, a first inter-island connection line electrically connecting scan signal lines of adjacent pixel islands 20, and a second inter-island connection line electrically connecting data signal lines of adjacent pixel islands 20, and/or a third inter-island connection line electrically connecting the power lines of the adjacent pixel islands 20, and the like.

In some embodiments, a pixel island 20 may include at least one pixel unit. In some embodiments, a pixel island 20 can include a group of pixels. In some embodiments of the present disclosure, a pixel may include several sub-pixels, such as a sub-pixel for red, a sub-pixel for blue, a sub-pixel for green, and the like. Signal communication between respective groups of pixels (or sub-pixels) of adjacent pixel islands can be achieved by the inter-island connection lines 40.

Hereinafter, a case where the scanning signal lines of the adjacent pixel islands 20 are connected by the inter-island connection lines 40 will be described as an example. A pixel island 20 may include a plurality of pixels, and thin film transistors (e.g., control transistors) of the plurality of pixels are electrically connected to the scan signal lines. Since the adjacent pixel islands 20 are separated by a trench 300 disposed therebetween, the scanning signal lines of the adjacent pixel islands 20 are independent from each other. The signal communication of the adjacent pixel islands 20 can be realized by providing the inter-island connection line 40 electrically connected to the two scanning signal lines of the adjacent pixel islands 20.

Since the gate of the control transistor is electrically connected to the corresponding scanning signal line in the island, these two can be formed into an integral structure by a same patterning process in the preparation thereof. Therefore, in such a case, when the scanning signal lines in the adjacent pixel islands 20 are electrically connected through the inter-island connection line 40, it can be achieved by connecting the gates of the control transistors in the adjacent pixel islands 20 through the inter-island connection line 40.

It should be understood that although FIG. 2 illustrates an example in which each pixel island 20 includes one pixel (or sub-pixel), two or more pixels (or sub-pixels) may be included in each pixel island 20 in actual production; therefore, apparently the present disclosure shall not be limited to the illustrated embodiments. In addition, the electrical connection manner between the inter-island connection line 40 and other electrical connection components (for example, data signal lines or other signal lines) on the adjacent pixel islands 20 is similar to that for the above-mentioned scanning signal lines, and details are not repeatedly described herein.

According to the display substrates provided by the exemplary embodiments of the present disclosure, signal communications between adjacent pixel islands 20 can be achieved by providing trench(s) 30 to divide the pixel region into pixel islands 20 and providing an inter-island connection line 40 corresponding to the trench(s) 30. According to embodiments of the present disclosure, the tensile property and the bending property of the display substrate can be effectively improved, and signal communications can be ensured, thus, improved display substrate can be obtained.

In some implementations, the inter-island connection line 40 can be received in or connected across and over the trench 30. The signal lines in the pixel islands 20 can be configured and routed in a normal manner. In some embodiments, the signal line between adjacent pixel islands 20, that is, the inter-island connection line 40, may be partially disposed within the trench 30. In such a case, depending on the applications, the inter-island connection line 40 can be electrically isolated from the undesired components of the pixel islands to avoid undesired electrical connections. In another embodiment, the inter-island connection line 40 can be provided to span across the trench 30 to effect signal line communication of adjacent two pixel islands 20.

It should be noted that although FIG. 2 is described by taking the inter-island connection line 40 connected over the trench 30 as an example, those skilled in the art would readily understand from the present disclosure that the inter-island connection line 40 can be configured in such a manner that it is at least partially accommodated in the trench 30, and thus this manner will not be description in further details.

In addition, as shown in FIG. 2, the trench 30 may be filled with an insulating material 300, such as, an organic insulating material.

In the following, the signal loading mode is exemplified by taking the scanning signal as an example for the case where the foregoing display substrate is applied to an OLED display. In a specific implementation, when the OLED display is in operation, the scan signals may be sequentially loaded to the scan signal lines corresponding to the pixels (or sub-pixels) of each row through cascaded GOA units. For the scan signals for each stage, on one hand, the same row of pixels within the pixel islands 20 are connected to the same intra-island scan signal line. On the other hand, the intra-island scanning signal lines of the adjacent two pixel islands 20 can be electrically connected through the inter-island connection lines 40 in a bridging manner to provide connection for scanning signal between the pixel islands 20. In this way, the scan signal can be transmitted from a pixel island 20 to another pixel island 20 through the inter-island connection line 40, and then transmitted from the another pixel island to a next pixel island in such a manner, till to all the target pixel islands. As such, the scan signal loading for this stage is completed.

In the example embodiments, the shape of the pixel island 20 may include any one of a circular shape or a polygon such as a triangle, a diamond, a rectangle, or the like; the present disclosure is not limited thereto.

In the exemplary embodiments, as the inter-island connection line 40, a stretchable wire, such as a wire made of a flexible material and/or a wire suitable for stretching (e.g., the wire may have a curved shape), may be adopted. Optionally, the inter-island connection line 40 may be a flexible wire, such as a wire formed of a flexible material such as silver nanowires, carbon nanotubes, or an organic conductive material. The flexible wire as good tensile property and can ensure an effective connection of the wires when the display substrate is bent.

Figure 3:
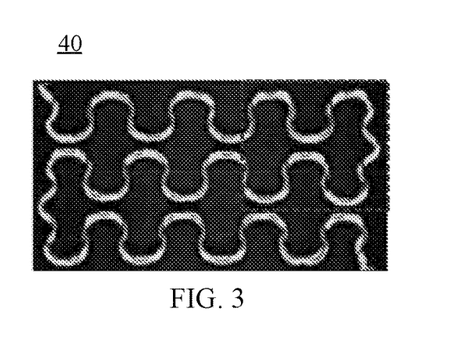
FIG. 3 is a schematic view showing a shape of an inter-island connection line according to an exemplary embodiment of the present disclosure.
Figure 4:
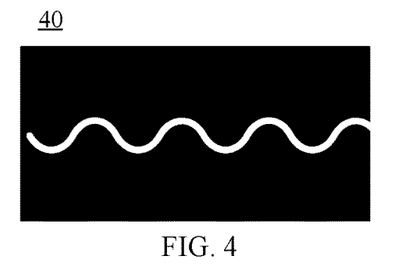
FIG. 4 is a schematic view showing a shape of an inter-island connection line according to another exemplary embodiment of the present disclosure.
Figure 5:
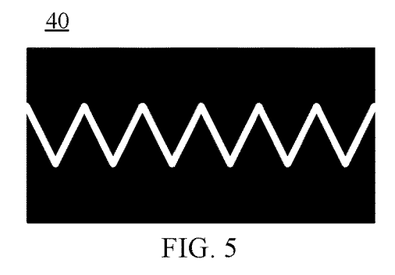
FIG. 5 is a schematic view showing the shape of an inter-island connection line according to a still further exemplary embodiment of the present disclosure.

Optionally, the inter-island connection line 40 may also adopt a curved wire or a polygonal-line wire, such as a horseshoe shape as shown in FIG. 3, a wave shape as shown in FIG. 4, or a zigzag shape as shown in FIG. 5. The wire may be a metal wire. Since the stretchability of the metal wire is inferior to that of the flexible wire, if it is set to be a linear structure, the overall tensile property of the display substrate may be affected, so it is configured to have a curved structure or a polygonal-line structure, thereby tensile property of the metal wire can be improved, and effective connection of the wires can be ensured when the display substrate is bent. Alternatively, the polygonal line shape can be configured to have a certain curvature at the bends thereof.

It should be noted that the above two embodiments may be used alone or in combination. That is, the inter-island connection line 40 may be a linear flexible wire, a curved/folded metal wire, or a curved/folded flexible wire. There is no particular limitation on the inter-island connection line as long as the inter-island connection line 40 has stretchability.

Figure 6:
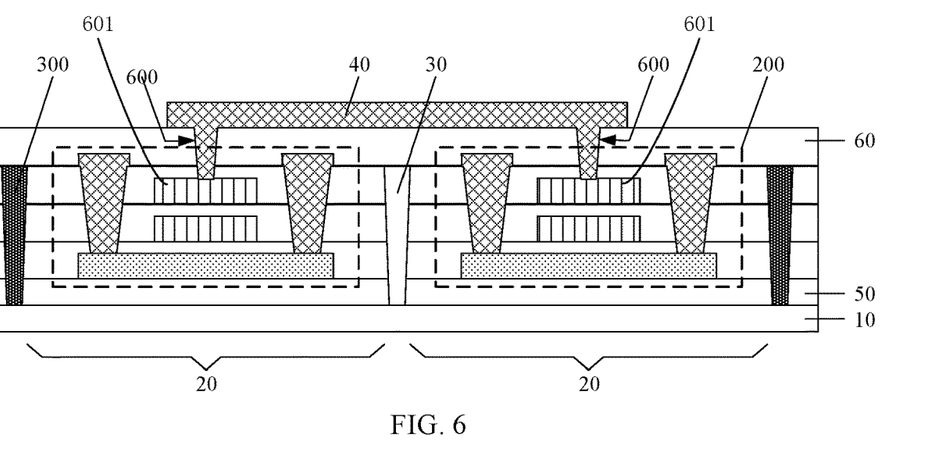
FIG. 6 is a schematic structural view showing a display substrate according to an exemplary embodiment of the present disclosure.

In an exemplary embodiment, as shown in FIG. 6, the display substrate may further include a buffer layer 50 over the base substrate 10, and an insulating layer 60 located on a side of the inter-island connection line 40 near the base substrate 10. As shown in FIG. 6, the insulating layer 60 may be located between the inter-island connection line and the corresponding islands. The inter-island connection line 40 can be electrically connected to the components in the corresponding islands, for example, through holes located in the insulating layer. For example, the inter-island connection line 40 may be electrically connected to the gate of the thin film transistor 200 through the first hole 600 located in the insulating layer 60.

In an embodiment, the insulating layer 60 may be an organic insulating layer, and the trench 30 may penetrate the films/layers between the flexible substrate 10 and the insulating layer 60. In some embodiments, the trench 30 can be configured to extend up to the flexible substrate 10. Since organic material has good tensile property, it is advantageous to configure the insulating layer 60 as an organic insulating layer to improve the tensile property of the display substrate.

In another embodiment, the insulating layer 60 may also be an inorganic insulating layer. In such a case, the trench 30 may penetrate through the films/layers between the flexible substrate 10 and the inter-island connection line 40. Since the tensile property of inorganic material may be inferior to that of organic material, in this embodiment the trench 30 can be configured to also penetrate the inorganic insulating layer, which may be advantageous to improve the tensile property of the display substrate.

Further, the display substrate may further include an organic insulating material 300 filled in the trenches 30. The bottom of the organic insulating material 300 may be in contact with the flexible substrate 10, and the top of the organic insulating material 300 may contact or even penetrate the insulating layer 600. Since the organic insulating material 300 has good stretchability, it contributes to the overall tensile property of the display substrate.

In some embodiments, other materials in the trench 30 may be removed by, for example, an exposure and development step, leaving only the elastic organic insulating material 300 to form a deep trench in the trench 30 such that the inter-island connection line is remained in the deep trench in the trench 30.

Figure 7:
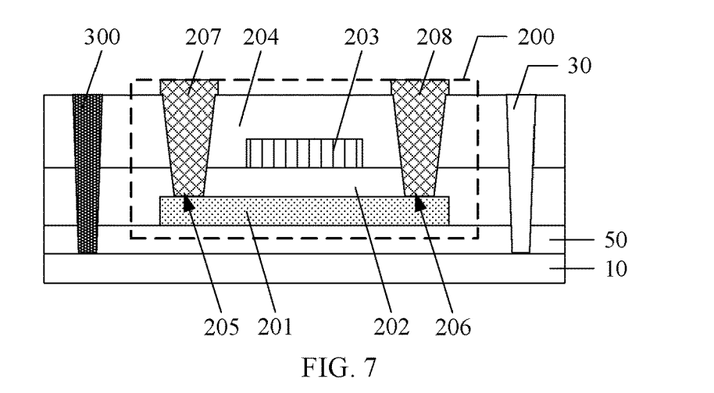
FIG. 7 is a schematic structural view showing a thin film transistor according to an exemplary embodiment of the present disclosure.

For example, as shown in FIG. 7, the thin film transistor 200 may include a semiconductor active layer 201 on a buffer layer 50, a gate insulating layer 202 over the semiconductor active layer 201, and a gate 203 over the gate insulating layer 202, an interlayer insulating layer 204 over the gate 203, and a source 207 and a drain 208. The source 207 and the drain 208 are electrically connected to the semiconductor active layer 201 through the second hole 205 and the third hole 206, respectively. The inter-island connection line 40 is located on a side of the interlayer insulating layer 204 facing away from the flexible substrate 10 and in a different layer from the source 207 and the drain 208.

In the display substrate provided by the exemplary embodiment, the pixel region can be divided into pixel islands 20. Wrings in the pixel island 20 can be normally routed. Between the pixel islands 20, an inter-island connection line 40 is provided after the source and drain metal layers are formed. According to the embodiments of the present disclosure, good stretchability can be obtained, and wiring layout can be facilitated.

It should be noted that in the display substrates according to the exemplary embodiments, a single gate transistor structure shown in FIG. 2 or a dual gate transistor structure may be adopted. It is to be understood that the present disclosure shall not be limited to the embodiments described herein or illustrated.

Figure 8:
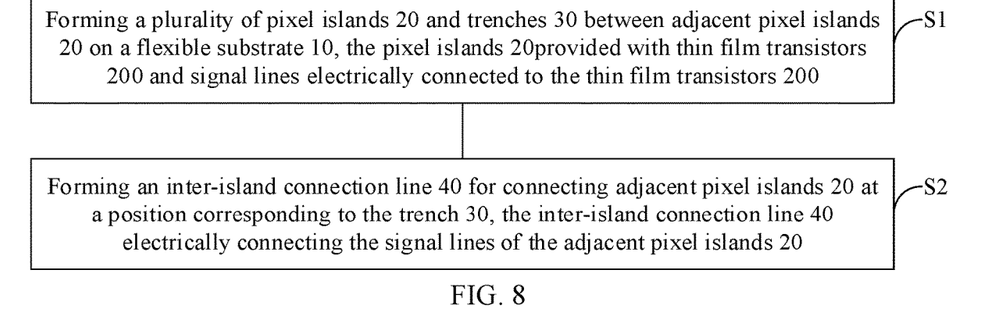
FIG. 8 is a flow chart schematically showing a method of preparing a display substrate according to an exemplary embodiment of the present disclosure.

According to an example embodiment of the present disclosure, a method of preparing a device (e.g., a display substrate) is also provided. As shown in FIG. 8, the preparing method may include following steps.

At step S1, a plurality of pixel islands 20 and trenches 30 between adjacent pixel islands 20 are formed on a flexible substrate 10. The pixel islands 20 are provided with thin film transistors 200 and signal lines electrically connected to the thin film transistors 200.

At step S2, an inter-island connection line 40 for connecting adjacent pixel islands 20 is formed at a position corresponding to the trench 30. The inter-island connection line 40 electrically connects the signal lines of the adjacent pixel islands 20.

According to the method of preparing the display substrate of the exemplary embodiment of the present disclosure, the trenches 30 are provided to divide the pixel region into the pixel islands 20, and signal communication between adjacent pixel islands 20 is realized by the inter-island connection line 40. According to the embodiments of the present disclosure, the tensile property and the bending property of the display substrate can be effectively improved while ensuring signal communication, thus a bendable display substrate can be provided.

The method for preparing the device will be exemplarily described below with reference to the accompanying drawings, taking a display panel including a thin film transistor as an example.

Figure 9:
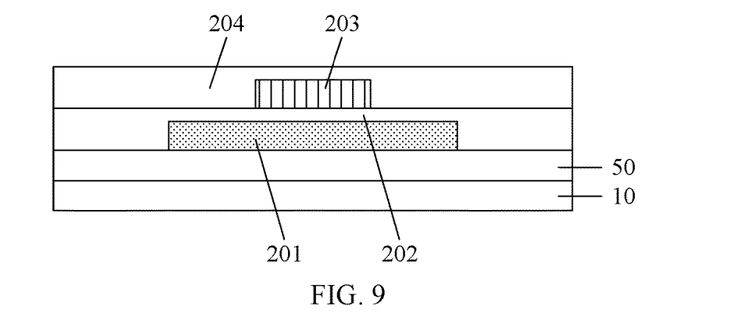
FIGS. 9 to 11 are schematic diagrams showing a process of preparing a display substrate according to an exemplary embodiment of the present disclosure.

First, referring to FIG. 9, a structure is formed on a flexible substrate 10. The structure may sequentially include a buffer layer 50, an optional light shielding layer (not shown) for thin film transistor 200, a semiconductor active layer 201, a gate insulating layer 202, a gate 203, and an interlayer insulating layer 204. In some embodiments, the structure may further include electrical connection components, such as signal lines. The structure can be designed according to the distribution of the islands 20 predetermined in advance. In the area corresponding to the pixel islands 20 to be formed, the signal lines (if any) can be normally routed, and in a corresponding area where the trenches 30 among the pixel islands 20 are to be formed, the electrical connection components such as signal lines are not formed. That is, the electrical connection components are intra-island (or local) connection component.

Figure 10:
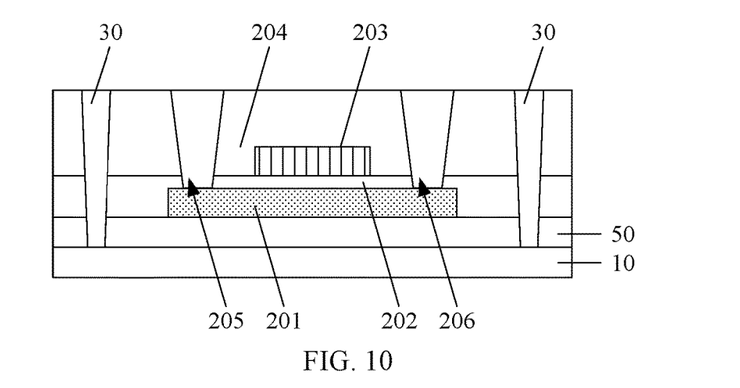

Then, referring to FIG. 10, trenches 30 are formed in the structure. The trenches 30 penetrate through the interlayer insulating layer 204, the gate insulating layer 202, and the buffer layer 50 to separate the pixel islands 20. Holes 205 and 206 are formed in the interlayer insulating layer 204 and the gate insulating layer 202; the holes may be formed while forming the trenches 30, but the present disclosure is not limited thereto. Holes 205 and 206 can be used for the fabrication of source 207 and drain 208 of thin film transistor 200. In some embodiments, the bottoms of the trenches 30 can also be configured to be proximate to the flexible substrate (i.e., only extend into the buffer substrate 50 (if any) and adjacent to the flexible substrate). In other embodiments, the trenches 30 can be formed to extend to (or even into) the flexible substrate 10; as such, it is more advantageous to enhance the bending property of the display substrate.

It is also possible to form openings 205 and 206 in the structure (or the corresponding island) while forming the trenches 30. The openings 205 and 206 can be used, for example, to form a source electrode and a drain electrode or contacts connected to the active layer; it should be understood that the present disclosure is not limited thereto.

Figure 11:
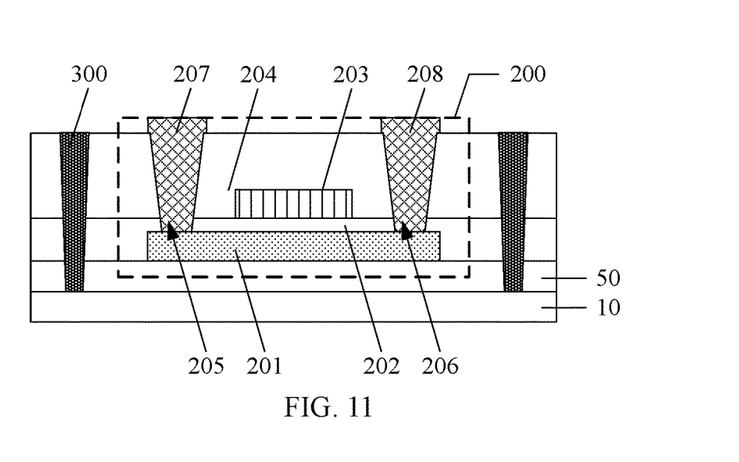

Next, referring to FIG. 11, the trenches 30 are filled with an organic insulating material 300, such as, for example, polyimide (PI) or polydimethylsiloxane (PDMS) or the like. As the organic insulating material 300, preferably, a material which has good tensile property and can be processed by a photolithography and patterning process is adopted. Thereafter, a source 207 and a drain 208 are formed in the second hole 205 and the third hole 206, respectively. As such, a basic structure of, for example, the transistor 200 in the pixel island 20 is formed. It should be noted that in other embodiments, the trenches 30 may be formed first and filled with the organic insulating material 300; afterwards, the second hole 205 and the third hole 206 are formed and the source 207 and the drain 208 are therein; or vice versa. For example, in other embodiments, the second hole 205 and the third hole 206 may be formed first and the source 207 and the drain 208 may be formed therein, after which the trenches 30 are formed and filled with the organic insulating material 300.

Referring back to FIG. 2, an insulating layer 60 (e.g., an organic insulating layer) is formed over the pixel islands 20. At least one opening (e.g., hole 600) may be formed in the insulating layer 60. Thereafter, an inter-island connection lines 40 are formed over the organic insulating layer 60. The inter-island connection lines 40 can be electrically connected to the thin film transistor 200 (for example, electrodes thereof) through the openings 600. The inter-island connection line 40 can include, for example but not be limited to, a first inter-island connection line electrically coupled to the scan signal line, a second inter-island connection line electrically coupled to the data signal line, and/or a third inter-island connection line electrically coupled to the power signal line, etc. Signal communication between adjacent pixel islands 20 can be achieved by the inter-island connection line(s) 40.

Figure 12A:
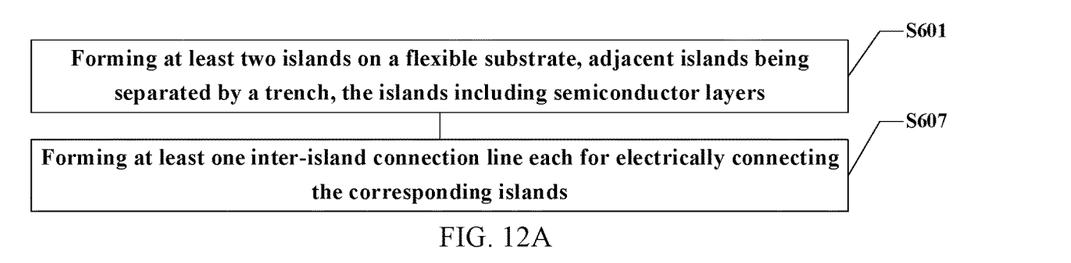
FIGS. 12A and 12B are flow charts respectively show methods of preparing a device in accordance with embodiments of the present disclosure.

According to some embodiments of the present disclosure, a method of preparing a device is also provided. As shown in FIG. 12A, the method may include the following steps. In step S601, at least two islands are formed on a flexible substrate, and adjacent islands are separated by a trench, the island including a semiconductor layer. In step S607, at least one inter-island connection line is formed, and each inter-island connection line is used to electrically connect the corresponding islands. The at least one inter-island connection line is configured to be stretchable.

In some implementations, the at least one inter-island connection line each is configured to span over a corresponding trench or received in a corresponding trench.

Figure 12B:
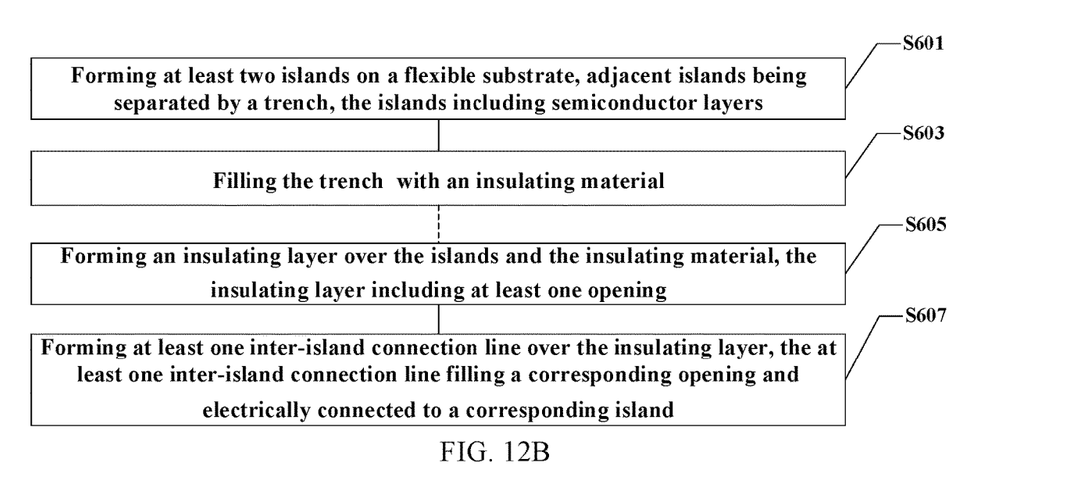

According to some embodiments of the present disclosure, a method of preparing a device is also provided. As shown in FIG. 12B, the method may include the following steps. In step S601, at least two islands are formed on the flexible substrate, and adjacent islands are separated by a trench, the island including a semiconductor layer. In step S603, the trench is filled with an insulating material. The insulating material may be, for example, an organic insulating material. In step S605, an insulating layer is formed over the islands and the insulating material, the insulating layer including at least one opening. In step S607, at least one inter-island connection line is formed over the insulating layer, and the at least one inter-island connection line fills a corresponding opening and is electrically connected to a corresponding island.

In some implementations, each of the islands includes a component for electrical connection, wherein each of the at least one inter-island connection line is electrically coupled to a component for electrical connection of a corresponding island. The inter-island connection line may be in a different layer from the component for electrical connection.

According to some exemplary embodiments of the present disclosure, there is also provided a display device comprising the above-described device (for example, a display substrate). The display device has good tensile property, and can be applied to a flexible display device, and particularly be suitable for a wearable device.

It should be noted that although the various steps of the methods of the present disclosure are described in a particular order in the drawings, this does not require or imply that the steps must be necessarily performed in that particular order, or that a desired effect needs all the steps described to be performed. Additionally or alternatively, certain steps may be omitted, multiple steps may be combined into one step to be executed, and/or one step may be divided into multiple steps to be conducted.

Other embodiments of the present disclosure will be apparent to those skilled in the art after reading or practicing the present disclosure. The present application is intended to embrace any variations, uses, or adaptations of the present disclosure, which are in accordance with the general principles of the present disclosure and may include common general knowledge or common technical means in the art that may be not described in the present disclosure. The specification and examples are illustrative only, and the scope and spirit of the present disclosure is defined by the appended claims only.

It is to be understood that the present disclosure shall not be limited to the precise structures and details as above described and illustrated in the drawings, and various changes and modifications can be made to the present disclosure without departing the scope and spirit thereof. The scope of the present disclosure is to be defined only by the appended claims.

What is claimed is:
1. A device comprising:
a flexible substrate;

at least two islands on the flexible substrate, each of the islands including a semiconductor layer, adjacent islands of the at least two islands being separated by a trench;

at least one inter-island connection line each for electrically connecting respective adjacent islands; and an organic insulating material filled in the trench.

2. The device according to claim 1, wherein the at least one inter-island connection line is configured to:
span over the trench between the respective adjacent islands, or
be at least partially received in the trench between the respective adjacent islands.

3. The device according to claim 1, wherein the at least one inter-island connection line is made of a flexible material or has a shape suitable for being stretched.

4. The device according to claim 1, wherein the islands have a shape comprising circle or polygon, and the polygon comprises any one of a triangle, a diamond, and a rectangle.

5. The device according to claim 1, wherein the islands are adaptable to form pixels therein, each of the pixels comprising a device for receiving or emitting light and a semiconductor device associated with the device for receiving or emitting light.

6. The device according to claim 1, further comprising:
an insulating layer located between the at least one inter-island connection line and corresponding islands,
wherein the at least one inter-island connection line is electrically connected to a component of a corresponding island through a hole in the insulating layer.

7. The device according to claim 6, wherein the insulating layer comprises one of the following: an organic insulating layer or an inorganic insulating layer.

8. The device according to claim 1,
wherein the islands include thin film transistors each of which includes a source and a drain, and
wherein the at least one inter-island connection line is located at a different layer from the source and the drain.

9. The device according to claim 1, wherein the device is a display substrate or a sensor substrate.

10. The device according to claim 1, wherein each of the islands includes:
a buffer layer over the flexible substrate;
the semiconductor layer over the buffer layer;
a first insulating layer over the semiconductor layer; and
a gate over the first insulating layer,
wherein the trench extends to the flexible substrate.

11. The device according to claim 1, wherein each of the islands comprises a component for electrical connection, wherein each of the at least one inter-island connection line is electrically connected to the components for electrical connection of the respective adjacent islands,
wherein the at least one inter-island connection line is located at a different layer from the components for electrical connection.

12. The device according to claim 1, wherein each of the islands comprises:
a buffer layer over the flexible substrate;
the semiconductor layer over the buffer layer;
a first insulating layer over the semiconductor layer;
a gate over the first insulating layer;
an inter-layer insulating layer over the gate and the first insulating layer; and
a component for electrical connection over the inter layer insulating layer,
wherein the trench extends to the flexible substrate.

13. A method of preparing a device, comprising:
forming a buffer layer over a flexible substrate;
forming a patterned active layer over the buffer layer;
forming a first insulating layer over the patterned active layer;
forming a gate over the first insulating layer;
forming a second insulating layer over the gate and the first insulating layer;
forming one or more trenches to form at least two islands, wherein the one or more trenches penetrate through the second insulating layer, the first insulating layer and the buffer layer;
forming a third insulating layer over the islands;
forming at least two openings each at least extending through the third insulating layer; and
forming at least one inter-island connection line each for electrically connecting respective adjacent islands, the at least one inter-island connection line each filling respective two openings and being electrically connected to respective adjacent islands.

14. The method of claim 13, wherein the at least two openings each extending through the second insulating layer and the third insulating layer, and to the gate, the at least one inter-island connection line each filling respective two openings of adjacent islands and being electrically connected to the gates of respective adjacent islands.

15. The method of claim 13, before forming the third insulating layer over the islands, further comprising:
forming holes extending at least through the second insulating layer and the first insulating layer, and to the patterned active layer; and
filling the holes with a conductive material to form source electrodes and drain electrodes for the respective islands.

16. The method of claim 15, wherein:
each of the at least two openings is formed to extend through the third insulating layer and to the source electrode or the drain electrode for a respective island; and
the at least one inter-island connection line is formed to be connected to the source electrode or the drain electrode for the respective island through one of the at least two openings.

17. The method of claim 13, wherein the at least two openings each extending through the third insulating layer, and to the source and drain layer, the at least one inter-island connection line each filling respective two openings of adjacent islands and being electrically connected to the source and drain layer of respective adjacent islands.

18. The method of claim 13, further comprising:
before forming the one or more trenches,
forming a patterned conductive layer over the second insulating layer, and
forming an inter-layer insulating layer over a layer of components for electrical connection and the second insulating layer;
wherein the one or more trenches are formed to penetrate through the inter-layer insulating layer, the second insulating layer, the first insulating layer and the buffer layer,
wherein the at least two openings each extending through the third insulating layer and the inter-layer insulating layer, and to the patterned conductive layer, the at least one inter-island connection line each filling respective two openings of adjacent islands and being electrically connected to the patterned conductive layer of respective adjacent islands.

19. The method of claim 13, before forming the third insulating layer over the islands, further comprising:
    filling the one or more trenches with an insulating material.

\* \* \* \* \*